(12) United States Patent
Satoh

(10) Patent No.: US 9,891,641 B2
(45) Date of Patent: Feb. 13, 2018

(54) EQUIPMENT HAVING NOISE ELIMINATION FUNCTION, PLL CIRCUIT AND VOLTAGE/CURRENT SOURCE

(71) Applicant: Kabushiki Kaisha Toshiba, Minato-ku, Tokyo (JP)

(72) Inventor: Yuji Satoh, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/062,723

(22) Filed: Mar. 7, 2016

(65) Prior Publication Data
US 2017/0075370 A1 Mar. 16, 2017

(30) Foreign Application Priority Data
Sep. 14, 2015 (JP) .................. 2015-180816

(51) Int. Cl.
*H03L 7/06* (2006.01)
*G05F 1/46* (2006.01)
*H03L 7/099* (2006.01)
*H03L 7/091* (2006.01)
*H03K 19/003* (2006.01)

(52) U.S. Cl.
CPC ....... *G05F 1/468* (2013.01); *H03K 19/00346* (2013.01); *H03L 7/091* (2013.01); *H03L 7/0991* (2013.01); *H03L 2207/50* (2013.01)

(58) Field of Classification Search
USPC .................. 327/147–149, 156–158
See application file for complete search history.

(56) References Cited

U.S. PATENT DOCUMENTS

| 5,388,080 A * | 2/1995 | Feintuch | G10K 11/178 367/135 |
| 6,147,513 A * | 11/2000 | Bui | H03K 19/0027 326/83 |
| 7,113,011 B2 * | 9/2006 | Leung | H02M 3/33576 327/149 |
| 7,532,078 B2 * | 5/2009 | Agarwal | G01R 31/2884 324/750.03 |
| 7,778,610 B2 * | 8/2010 | Staszewski | H03B 21/00 327/156 |
| 7,805,122 B2 * | 9/2010 | Lerner | H03B 21/00 327/156 |
| 8,139,685 B2 | 3/2012 | Simic et al. | |
| 8,203,390 B2 | 6/2012 | Kobayashi | |

(Continued)

FOREIGN PATENT DOCUMENTS

JP 05-300183 A 11/1993
JP 5338577 B2 8/2013

*Primary Examiner* — Adam Houston
(74) *Attorney, Agent, or Firm* — White & Case LLP

(57) ABSTRACT

Equipment having a noise elimination function according to embodiments includes a signal generator configured to generate a signal in which a noise component other than thermal noise is discretely included, a noise detecting unit configured to detect the noise component other than the thermal noise discretely included in output of the signal generator, and a signal correcting unit configured to eliminate the noise component detected by the noise detecting unit from the output of the signal generator, and generation of noise other than thermal noise is detected, and a signal from which noise is reliably eliminated is generated.

14 Claims, 13 Drawing Sheets

(56) References Cited

U.S. PATENT DOCUMENTS

| | | | | |
|---|---|---|---|---|
| 8,570,082 B1* | 10/2013 | Kuo | ............................ | H03L 1/00 |
| | | | | 327/158 |
| 8,773,182 B1* | 7/2014 | Degani | .................... | H03L 7/085 |
| | | | | 327/147 |
| 8,836,315 B2 | 9/2014 | Satoh et al. | | |
| 9,007,139 B2 | 4/2015 | Kousai et al. | | |
| 9,083,349 B1* | 7/2015 | Townsend | ................. | H03L 5/00 |
| 2006/0033582 A1* | 2/2006 | Staszewski | .............. | H03L 7/085 |
| | | | | 331/16 |
| 2008/0042708 A1* | 2/2008 | Kimura | .................... | H03L 7/085 |
| | | | | 327/159 |
| 2008/0315959 A1* | 12/2008 | Zhuang | .................... | H03C 5/00 |
| | | | | 331/17 |
| 2009/0074199 A1* | 3/2009 | Kierstein | .............. | G10K 11/175 |
| | | | | 381/71.6 |
| 2009/0262877 A1* | 10/2009 | Shi | ........................... | H03L 1/022 |
| | | | | 375/376 |
| 2011/0234326 A1* | 9/2011 | Kobayashi | .............. | H03L 7/197 |
| | | | | 331/1 A |
| 2012/0081339 A1* | 4/2012 | Mouri | ................... | H03D 13/003 |
| | | | | 345/204 |
| 2013/0002317 A1* | 1/2013 | Frantzeskakis | ........... | H03L 7/18 |
| | | | | 327/156 |
| 2014/0111252 A1* | 4/2014 | Zhuo | ........................ | H03D 7/12 |
| | | | | 327/109 |
| 2014/0301569 A1* | 10/2014 | Every | ...................... | H04R 3/04 |
| | | | | 381/103 |
| 2015/0008961 A1* | 1/2015 | Kim | ........................ | H03L 7/085 |
| | | | | 327/12 |
| 2015/0318861 A1* | 11/2015 | Staszewski | ......... | G06F 9/30032 |
| | | | | 455/129 |
| 2015/0340078 A1* | 11/2015 | Jose | ........................ | G11C 7/222 |
| | | | | 365/191 |
| 2016/0118990 A1* | 4/2016 | Faisal | .................... | H03K 5/134 |
| | | | | 327/156 |
| 2016/0126960 A1* | 5/2016 | Whatmough | ......... | H03L 7/0992 |
| | | | | 327/156 |
| 2016/0156362 A1* | 6/2016 | Kim | ........................ | H03L 7/189 |
| | | | | 327/159 |
| 2016/0182067 A1* | 6/2016 | Liu | ........................ | H03L 7/091 |
| | | | | 327/158 |
| 2016/0204787 A1* | 7/2016 | Lotfy | ...................... | H03L 7/085 |
| | | | | 327/142 |
| 2016/0358958 A1* | 12/2016 | Miyoshi | ............ | H01L 27/14612 |
| 2016/0373094 A1* | 12/2016 | Yayla | .................... | H03K 3/0315 |
| 2017/0032750 A1* | 2/2017 | Shao | ...................... | G09G 3/3648 |
| 2017/0040944 A1 | 2/2017 | Satoh | | |
| 2017/0053639 A1* | 2/2017 | Lu | ........................ | G10K 11/178 |
| 2017/0075370 A1* | 3/2017 | Satoh | ...................... | G05F 1/468 |

\* cited by examiner

|  | SIGNAL GENERATOR | NOISE DETECTOR | SIGNAL CORRECTOR |
| --- | --- | --- | --- |
| SILICON OSCILLATOR | OSCILLATOR | PHASE DETECTOR | ADPLL |
| IMAGE SENSOR | INITIAL-STAGE AMPLIFIER | RANDOM NOISE DETECTOR | IMAGE PROCESSING UNIT |
| REFERENCE VOLTAGE/CURRENT SOURCE | BANDGAP REFERENCE | POTENTIAL DIFFERENCE DETECTOR | VOLTAGE/CURRENT CORRECTOR |

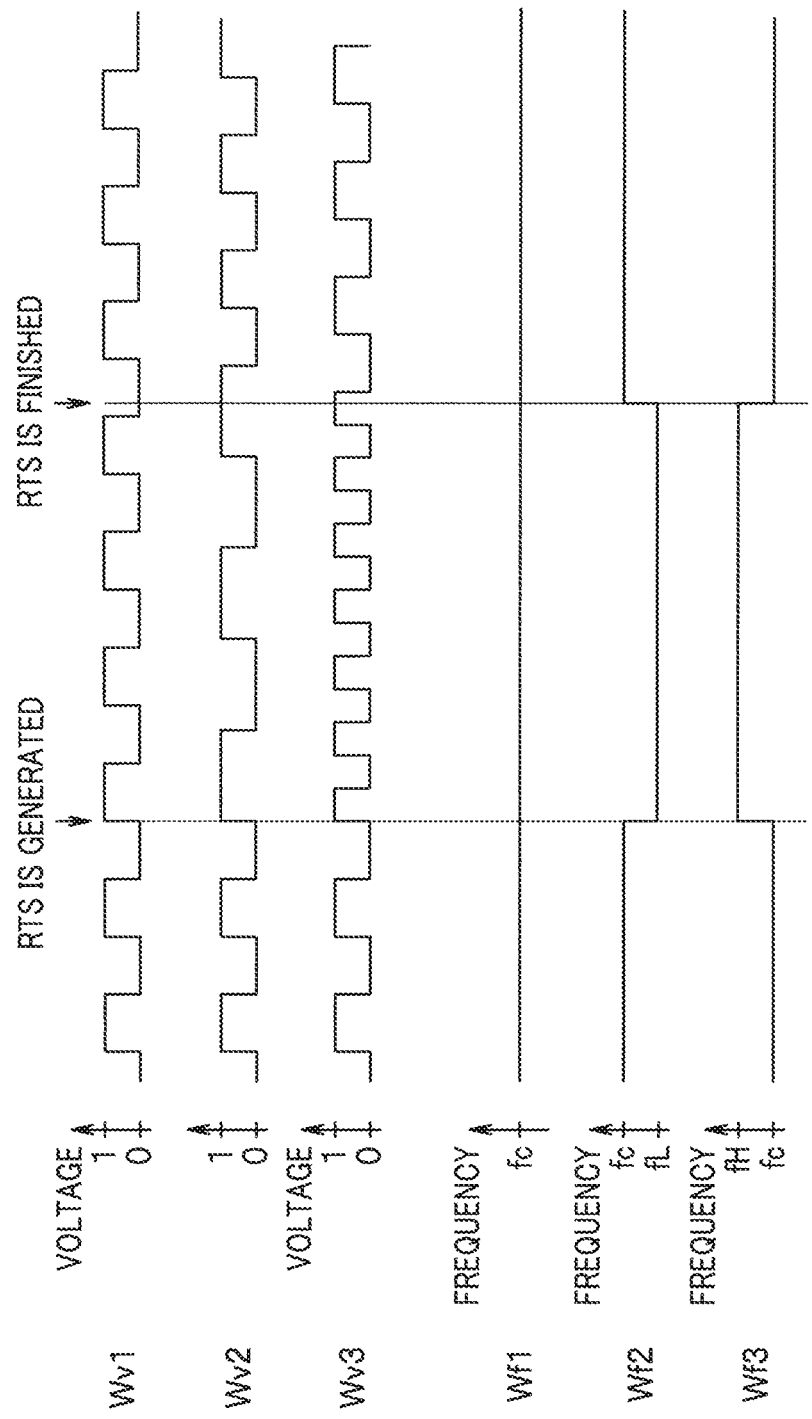

US 9,891,641 B2

EQUIPMENT HAVING NOISE ELIMINATION FUNCTION, PLL CIRCUIT AND VOLTAGE/CURRENT SOURCE

CROSS REFERENCE TO RELATED APPLICATION

This application is based upon and claims the benefit of priority from the prior Japanese Patent Applications No. 2015-180816, filed on Sep. 14, 2015; the entire contents of which are incorporated herein by reference.

FIELD

Embodiments described herein relate generally to equipment having a noise elimination function, a PLL circuit and a voltage/current source.

BACKGROUND

Typically, thermal noise can be eliminated by being averaged. However, noise other than thermal noise cannot be eliminated through averaging processing.

BRIEF DESCRIPTION OF THE DRAWINGS

FIG. 6 is an explanatory diagram for explaining a frequency of reference oscillation output f0 in FIG. 5A;

DETAILED DESCRIPTION

Equipment having a noise elimination function according to embodiments includes a signal generator configured to generate a signal in which a noise component other than thermal noise is discretely included, a noise detecting unit configured to detect the noise component other than the thermal noise discretely included in output of the signal generator, and a signal correcting unit configured to eliminate the noise component detected by the noise detecting unit from the output of the signal generator.

The embodiments of the present invention will be described in detail below with reference to the drawings.

First Embodiment

Figures 1, 2:
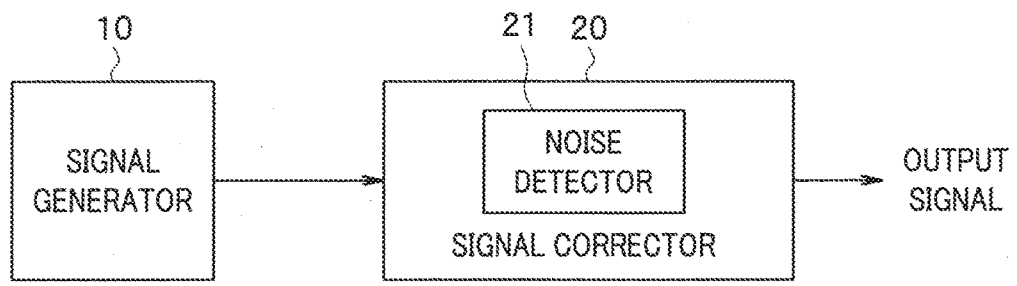
FIG. 1 is a circuit diagram illustrating equipment having a noise elimination function according to a first embodiment.
FIG. 2 is a diagram illustrating one example of equipment which can be configured with the equipment having the noise elimination function in FIG. 1.

FIG. 1 is a circuit diagram illustrating equipment having a noise elimination function according to a first embodiment. The signal generator 10 generates various kinds of signals. The signals generated by the signal generator 10 transmit information using a voltage, a current, a phase, a frequency, or the like. These signals include thermal noise, and include noise other than the thermal noise, for example, RTS (random telegraph signal) noise, BTI (bias temperature instability) noise, HCI (hot carrier injection) noise, TDDB (time dependent dielectric breakdown) noise, or the like. Various kinds of signals from the signal generator 10 are provided to a signal corrector 20.

Among various types of electronic/electric equipment, there is one which has a mechanism for cancelling influence of noise. For example, in a PLL circuit, noise can be eliminated using a loop filter (LPF) in a PLL loop. However, noise which can be eliminated by such kinds of filters is thermal noise (white noise) generated by thermal motion (Brownian motion) by free electrons.

For example, at a transistor, flicker noise which unpredictably changes at a low frequency is generated. The flicker noise is also referred to as 1/f noise, and, for example, is caused by RTS noise. It is considered that the RTS noise is generated by one of carriers (electrons/holes) moving within a channel of a MOS transistor being captured at a trap level existing within a gate insulation film, or the like, and a threshold voltage fluctuates due to the RTS noise, which randomly causes erroneous operation of a circuit using the transistor.

Further, as the noise other than thermal noise, there are BTI noise, HCI noise, TDDB noise, or the like, other than the RTS noise. These types of noise are also superimposed on output of electronic equipment, or the like, as noise at a low frequency which unpredictably fluctuates as with the RTS noise. For example, at a silicon oscillator, a failure such as fluctuation of an oscillation frequency occurs by noise such as the RTS noise, the BTI noise, the HCI noise and the TDDB noise (hereinafter, referred to as noise other than thermal noise). Influence of the noise other than the thermal noise becomes evident as the transistor becomes finer.

The signal corrector 20 has a noise detector 21. Note that there is a case where the noise detector 21 is provided outside the signal corrector 20. The noise detector 21 detects noise other than thermal noise included in a signal from the signal generator 10. The signal corrector 20 eliminates a noise component included in the signal from the signal generator 10 using a detection result of the noise detector 21. That is, the signal corrector 20 is configured to not only eliminate the thermal noise but also eliminate noise other than thermal noise and output the signal as an output signal.

FIG. 2 is a diagram illustrating one example of equipment which can be configured with the equipment having the noise elimination function in FIG. 1. For example, when the equipment having the noise elimination function in FIG. 1 is applied to the silicon oscillator, the signal generator 10 can be configured with an oscillator. Such an oscillator generates oscillation output including 1/f noise which is noise other than thermal noise. Further, at the silicon oscillator, the noise detector 21 in FIG. 1 can be configured with a phase detector. This phase detector detects displacement of edges of output of the oscillator. Further, at the silicon oscillator, the signal corrector 20 in FIG. 1 can be configured with an ADPLL (all-digital phase locked loop). The ADPLL outputs oscillation output from which the 1/f noise is eliminated by correcting the displacement of the edges detected by the phase detector.

In a similar manner, when the equipment having the noise elimination function in FIG. 1 is applied to an image sensor, the signal generator 10 can be configured with a pixel unit and an initial-stage amplifier of a sensor. Such pixel unit and the initial-stage amplifier of the sensor generate an image signal including 1/f noise (random noise) which is noise other than thermal noise. Further, at the image sensor, the noise detector 21 in FIG. 1 can be configured with a random noise detector. This random noise detector detects the 1/f noise included in the image signal. Further, at the image sensor, the signal corrector 20 in FIG. 1 can be configured with an image processing unit. The image processing unit outputs an image signal from which the 1/f noise detected by the random noise detector is eliminated.

In a similar manner, when the equipment having the noise elimination function in FIG. 1 is applied to the reference voltage/current source, the signal generator 10 can be configured with a bandgap reference. Such a bandgap reference generates a reference voltage and a reference current including flicker noise which is noise other than thermal noise. Further, at the reference voltage/current source, the noise detector 21 in FIG. 1 can be configured with a potential difference detector. This potential difference detector detects the RTS noise included in a voltage and a current. Further, at the reference voltage/current source, the signal corrector 20 in FIG. 1 can be configured with a voltage/current corrector. The voltage/current corrector outputs a signal from which the RTS noise detected by the potential difference detector is eliminated.

In the present embodiment, in the signal generator 10, part or all of transistors configuring the signal generator 10 has a sufficiently small transistor size. For example, the transistor having a sufficiently small size is a transistor created at a size close to a minimum size manufactured according to a process rule, which is generally, 65 nm or less.

In such a transistor having a sufficiently small size (hereinafter, referred to as a downsized transistor), the number of sources of the RTS noise is relatively small. When the downsized transistor is employed, the number of carriers captured at the trap level becomes sufficiently small. That is, the number of sources of noise is reduced. By this means, the RTS noise is discretely generated at the downsized transistor. Further, at the downsized transistor, an output level of a current, a voltage, or the like, is sufficiently small, and the RTS noise greatly affects the output. That is, a difference of output of the downsized transistor is large between a case where the RTS noise is generated and a case where the RTS noise is not generated. In this way, in the output of the downsized transistor, because the RTS noise is discretely generated, and the output is significantly different between the case where the RTS noise is generated and the case where the RTS noise is not generated, it is easy to detect generation of the RTS noise.

For example, when the output of the signal generator 10 is one which transmits information using change in a voltage, a level of an output voltage of the signal generator 10 is significantly different between the case where the RTS noise is generated and the case where the RTS noise is not generated. Further, when the output of the signal generator 10 is one which transmits information using a frequency, an output frequency of the signal generator 10 is significantly different between the case where the RTS noise is generated and the case where the RTS noise is not generated. By this means, it is possible to easily detect the RTS noise.

Note that as a document which mathematically reviews the RTS noise, there is "Moments and Polyspectra of the Discrete-Time Random Telegraph Signal" (Bernard Picinbono, Fellow, IEEE). Further, measurement of the RTS noise is described in detail in a document, "Random Telegraph Noise of Deep-Submicrometer MOSFET's" (K. K. HUNG, P. K. KO, CHENMING HU, SENIOR MEMBER, IEEE, AND YIU CHUNG CHENG, MEMBER, IEEE).

Note that concerning other noise other than thermal noise as well as the RTS noise, by employing a downsized transistor, it is possible to reduce the number of sources of noise other than thermal noise, cause the noise other than thermal noise to be discretely generated, and make change in output larger between the case where the noise other than thermal noise is generated and the case where the noise other than thermal noise is not generated, so that it is possible to make it easy to detect generation of the noise other than thermal noise.

For example, while a degradation mechanism of the BTI noise is not completely explained at the present moment, it is known that the degradation is a phenomenon in which a threshold of the transistor fluctuates due to application of a high voltage or high temperature. By employing a downsized transistor, it is possible to reduce the number of sources of the BTI noise. Further, the BTI noise has large sensitivity to the threshold of the downsized transistor. That is, by employing the downsized transistor, it becomes easy to detect the BTI noise.

Further, the HCI noise causes fluctuation of a threshold, or the like, by large energy which is obtained from an electric field in a channel direction by a carrier within the channel being injected into a membrane across an energy barrier of a gate insulation film interface. Also concerning the HCI noise, by employing a downsized transistor, it is possible to reduce the number of sources. Further, the HCI noise has large sensitivity to the threshold of the downsized transistor. That is, also concerning the HCI noise, by employing the downsized transistor, it becomes easy to detect the noise.

Further, the TDDB noise is noise generated by, even when an electric field equal to or lower than a dielectric strength voltage is applied to the gate insulation film, if the electric field is applied over a long time period, the insulation film degrading and being damaged. Also concerning this TDDB noise, by employing the downsized transistor, it becomes easy to detect the noise.

That is, normally, in order to suppress noise at electronic equipment, a method for increasing the size of the transistor is employed. By increasing the sizes of the transistor, it is possible to suppress flicker noise. On the other hand, in the present embodiment, as described above, by reducing the size of the transistor, noise other than thermal noise is discretely generated, so that the noise other than thermal noise is easily detected.

In the embodiment configured as described above, the signal generator 10 generates a signal and outputs the signal to the signal corrector 20. The signal outputted by the signal generator 10 includes thermal noise and noise other than the thermal noise.

Because part or all of transistors of the signal generator 10 is configured with the downsized transistor and thus noise other than thermal noise is discretely generated, the noise detector 21 can detect noise other than thermal noise. For example, the noise detector 21 sequentially stores signals from the signal generator 10 and detects a change amount of the signals. When the change amount of the signals becomes larger than a predetermined threshold, the noise detector 21 determines that noise other than thermal noise is detected.

If the transistor employed in the signal generator 10 is a transistor having a sufficiently large size, noise other than thermal noise is continuously generated, and influence on the signals is relatively small, so that a change amount of the signals due to this noise is relatively small. Therefore, it is not easy to detect noise other than thermal noise.

On the other hand, when the downsized transistor is employed in the signal generator 10, noise other than thermal noise is discretely generated, and influence on the signals is relatively large, so that signals change relatively largely by the noise. By determining whether or not the change amount exceeds the threshold, the noise detector 21 can easily detect noise other than thermal noise.

The signal corrector 20 eliminates a noise component other than thermal noise detected by the noise detector 21 from the output of the signal generator 10 and outputs an output signal obtained by eliminating noise other than thermal noise. When the BTI noise, the HCI noise, the TDDB noise, or the like, which is noise other than thermal noise is eliminated from the output signal, it is possible to obtain a signal with extremely high accuracy. For example, when the output signal is a clock, it is possible to obtain an accurate clock frequency.

In this manner, in the present embodiment, by sufficiently reducing the size of the transistor employed in the signal generator, noise other than thermal noise is discretely generated. Further, the noise level is made sufficiently larger than the signal level.

By increasing the size of the transistor, influence of noise other than thermal noise can be relatively reduced. Therefore, conventionally, concerning the transistor in which large influence of noise other than thermal noise appears, such influence is addressed by increasing the size of the transistor. That is, while, in a typical signal processing circuit, by increasing the size of the transistor, a noise level is controlled to be sufficiently smaller than a signal level, in the present embodiment, concerning noise other than thermal noise, a noise level is controlled to be sufficiently larger than a signal level to, for example, approximately, 1/20 to 1/2000 by reducing S/N. By this means, also concerning noise other than thermal noise such as the RTS noise whose fluctuation is difficult to be predicted, it is possible to detect the noise at the noise detector, so that it is possible to obtain an output signal from which noise other than thermal noise is reliably eliminated.

Second Embodiment

Figure 3:
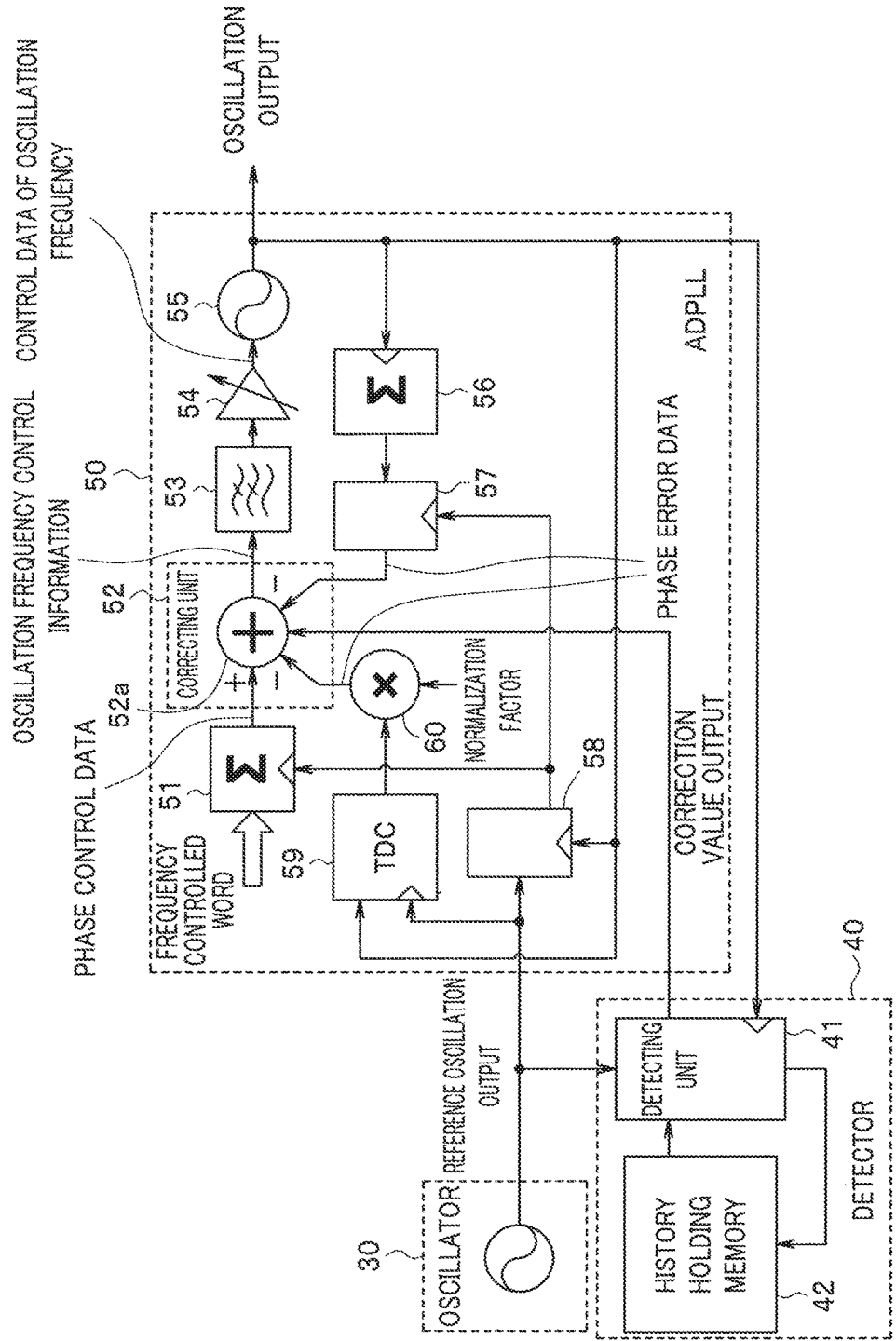
FIG. 3 is a circuit diagram illustrating a second embodiment.

FIG. 3 is a circuit diagram illustrating a second embodiment. In the present embodiment, the present invention is applied to the ADPLL.

In FIG. 3, an oscillator 30 corresponds to the signal generator 10 in FIG. 1, the ADPLL 50 corresponds to the signal corrector 20 in FIG. 1, and a detector 40 corresponds to the noise detector 21 in FIG. 1. The oscillator 30 generates reference oscillation output of a low frequency which is a basis of oscillation output generated by the ADPLL 50.

Figure 4:
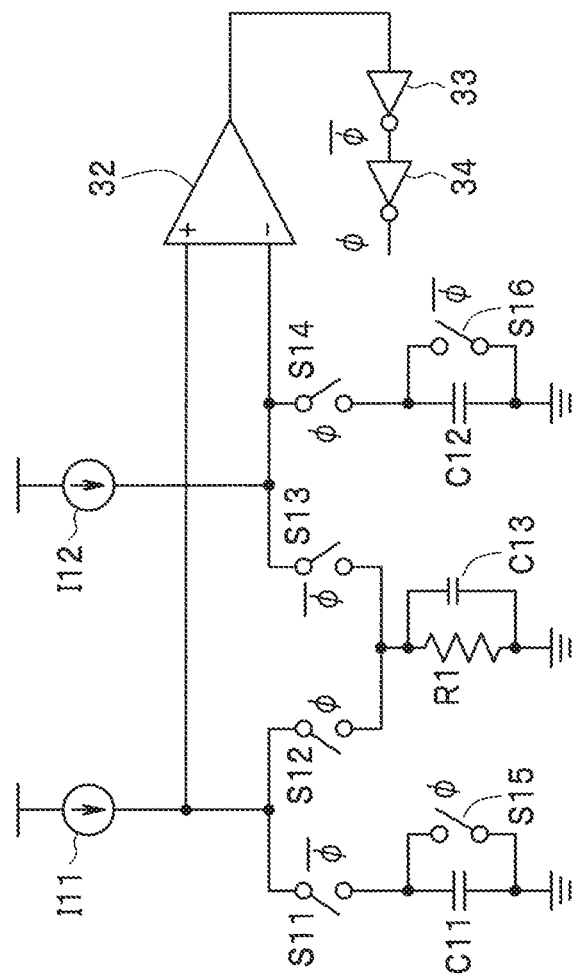
FIG. 4 is a circuit diagram illustrating one example of a specific circuit configuration of an oscillator 30 in FIG. 3.

FIG. 4 is a circuit diagram illustrating one example of a specific circuit configuration of the oscillator 30 in FIG. 3.

In FIG. 4, switches S11, S13 and S16 are turned on at the same time at a high level (hereinafter, referred to as an H level) of a control signal φ bar (hereinafter, referred to as /φ) which is an inversion signal of a control signal φ, and is turned off at the same time at a low level (hereinafter, referred to as an L level) of the control signal /φ. Switches S12, S14 and S15 are turned on at the same time at the H level of the control signal φ and turned off at the same time at the L level.

When the switches S11 and S13 are turned on, a current from a current source I11 flows in a capacitor C11 via the switch S11, and a terminal voltage of the capacitor C11 increases. In this manner, a voltage applied to a positive phase input terminal of a comparator 32 increases. Further, a current from a current source I12 flows in a resistance R1 via the switch S13. By a voltage drop of the resistance R1, a predetermined baseline voltage (reference voltage) is applied to a negative phase input terminal of the comparator 32. When the terminal voltage of the capacitor C11 becomes higher than the reference voltage by the resistance R1, the comparator 32 changes output from the L level to the H level.

By this means, the control signal /φ becomes the L level, and the control signal φ becomes the H level. Thus, the switches S11, S13 and S16 are turned off, the switches S12, S14 and S15 are turned on, and a capacitor C12 is charged with a current from the current source I12 via the switch S14. Further, a current from the current source I11 flows in the resistance R1, which causes a voltage drop.

The terminal voltage of the capacitor C12 is supplied to the negative phase input terminal of the comparator 32, and the reference voltage by the resistance R1 is supplied to the positive phase input terminal of the comparator 32. When the terminal voltage of the capacitor C12 exceeds the reference voltage by the resistance R1, output of the comparator 32 inverts from the H level to the L level. By this means, the control signal /φ becomes the H level, and the control signal φ becomes the L level. Thus, the switches S11, S13 and S16 are turned on, the switches S12, S14 and S15 are turned off, and similar operation is repeated.

The output of the comparator 32 inverts every time the terminal voltage of the capacitor C11 reaches the reference voltage or the terminal voltage of the capacitor C12 reaches the reference voltage. That is, from the comparator 32, oscillation output of a fixed period according to change of the terminal voltage based on baseline current values of the current sources 111 and 112 and capacitance of the capacitors C11 and C12, and according to the reference voltage based on the resistance value of the resistance R1 can be obtained. The oscillation output is supplied to the ADPLL 50 as reference oscillation output. Note that output of the comparator 32 is supplied to inverters 33 and 34, and control signals /φ and φ are generated every time the output of the comparator 32 inverts.

When an offset is generated at the comparator 32, a timing at which the output of the comparator 32 inverts changes due to influence of this offset. Therefore, when the reference voltage is supplied only to the negative phase input terminal of the comparator 32, an oscillation frequency changes for each element by a difference in an offset value. On the other hand, in the circuit in FIG. 4, the input terminal of the comparator 32 to which the reference voltage is given is switched every time the output of the comparator 32 inverts. By this means, influence of the offset is cancelled out between when the output of the comparator 32 is the H level and when the output is the L level, so that it is possible to maintain a fixed oscillation frequency regardless of a difference in an offset value.

In the present embodiment, a downsized transistor is employed as the current sources 111 and 112. If the current sources 111 and 112 are configured with transistors having a relatively large transistor size, there is a case where a current amount fluctuates due to generation of flicker noise which is difficult to be predicted. In this type of oscillator which uses such a current source, an oscillation frequency fluctuates with a relatively low frequency component due to fluctuation of the current amount. As will be described later, in the ADPLL, oscillation output also fluctuates due to fluctuation of a low frequency of such reference oscillation output.

On the other hand, when a downsized transistor is employed as the current sources 111 and 112, noise other than thermal noise included in the oscillation output of the oscillator 30 discretely appears as sufficiently large change with respect to a signal. That is, in the oscillation output of the oscillator 30, relatively large frequency change discretely occurs due to a noise component other than thermal noise.

In the present embodiment, noise other than thermal noise included in the reference oscillation output from the oscillator 30 is detected by the detector 40. The detector 40 has a detecting unit 41 to which the reference oscillation output is provided. The detecting unit 41 detects a period of the reference oscillation output using an output clock of a DCO 55 which will be described later as a time reference and provides a detection result to a history holding memory 42. The history holding memory 42 holds the detection result and outputs a history of the detection result to the detecting unit 41. The detecting unit 41 determines that a clock generated at a period other than a period of original reference oscillation output is a noise component other than thermal noise by comparing output of the history holding memory 42 and the reference oscillation output, generates correction value output for correcting influence of the clock and outputs the correction value output to a correcting unit 52 of the ADPLL 50.

Note that there are various possible configurations for the detector 40 as long as the detector 40 can detect a clock generated at a frequency which is relatively largely different from a frequency of the reference oscillation output. For example, the detecting unit 41 may count a time period between rising edges of the reference oscillation output and determine a clock at an edge at which a count value is relatively largely different (different by a predetermined threshold or greater) as a noise component other than thermal noise.

The ADPLL 50 has a digital control oscillator (hereinafter, referred to as a DCO) 55. The DCO 55 is configured to be able to generate and output oscillation output of an oscillation frequency according to an inputted digital value. The oscillation output of the DCO 55 is supplied to an accumulator 56 and provided as clock input to a flip-flop 58 and the detecting unit 41 of the detector 40. The flip-flop 58 provides the reference oscillation output to clock input terminals of the accumulator 51 and a flip-flop 57 at a clock timing of the oscillation output.

The accumulator 56 counts the oscillation output of the DCO 55, and a count value of the accumulator 56 is outputted by the flip-flop 57 to an adder 52a of the correcting unit 52 at a timing of the reference oscillation output. For example, when it is assumed that a frequency of the oscillation output of the DCO 55 is 2400 MHz, and a frequency of the reference oscillation output is 40 MHz, the flip-flop 57 outputs count values (60, 120, 180, . . . ) to the correcting unit 52 every time the count value of the accumulator 56 is added by 60. That is, the accumulator 56 and the flip-flop 57 indicate oscillation output of how many times of the reference oscillation output frequency is outputted. Note that the accumulator 56 may be configured to accumulate count values until being reset, in which case a value of a multiple of a value obtained by dividing the oscillation output frequency by the reference oscillation output frequency is outputted with accuracy corresponding to the reference oscillation output.

A TDC 59 can be configured with, for example, a plurality of delay elements having delay time sufficiently shorter than the period of the oscillation output. The TDC 59 receives the oscillation output of the DCO 55 and the reference oscillation output, obtains a phase difference between the oscillation output of the DCO 55 and the reference oscillation output with accuracy of delay time of the delay elements and outputs the phase difference to a multiplier 60. Note that the TDC 59 operates in synchronization with the reference oscillation output. The phase difference obtained by the TDC 59 is in units of delay time of the delay elements, and the multiplier 60 normalizes the phase difference obtained by the TDC 59 to a value corresponding to the reference oscillation output frequency by multiplying the phase difference from the TDC 59 by a normalization factor.

In this manner, phase error data in which the output of the flip-flop 57 is set as integer data of a phase error, and a phase difference of one period or less of the reference oscillation output which is the output of the multiplier 60 is set as decimal data of the phase error can be obtained. This phase error data is provided to the adder 52a of the correcting unit 52. Further, the output of the accumulator 51 is also provided to the adder 52a. A value of a ratio between a desired oscillation output frequency of the DCO 55 and the reference oscillation output frequency is inputted as Frequency Controlled Word from outside. The accumulator 51 may be configured to convert the value of the ratio which is the Frequency Controlled Word into phase difference information by applying time integration at the reference oscillation output period. For example, when the desired oscillation output frequency is 60 times of the reference oscillation output frequency, the phase difference information becomes 60, 120, 180, . . . for each output of the flip-flop 58. The accumulator 51 outputs this phase difference information to the adder 52a as phase control data.

A difference between a value of the phase control data and a value of the phase error data becomes information for controlling the oscillation frequency of the DCO 55 to the desired oscillation output frequency (oscillation frequency control information) using the reference oscillation output as a reference. The adder 52a adds the correction value output to the difference between the value of the phase control data and the value of the phase error data to obtain oscillation frequency control information. The oscillation frequency control information from the adder 52a is provided to a gain normalization unit 54 via the loop filter 53, and after a coefficient suitable for frequency control of the DCO 55 being given, supplied to the DCO 55 as control data of the oscillation frequency of the DCO 55. In this manner, basically, loop control is performed so that a difference between the phase error data and the phase control data becomes a predetermined value (0). That is, from the DCO 55, oscillation output of a frequency which is a multiplication result of the reference oscillation output frequency and the value of the ratio which is the Frequency Controlled Word can be obtained.

However, because flicker noise is mixed in the reference oscillation output, the oscillation output from the DCO 55 may also fluctuate due to fluctuation of the reference oscillation output frequency if only the difference between the value of the phase control data and the value of the phase error data is used. However, in the present embodiment, because a downsized transistor is employed as part of the oscillator 30, noise included in the reference oscillation output is highly likely to be discretely generated at a frequency relatively largely displaced compared to the original oscillation frequency, and the detecting unit 41 can detect influence of noise other than thermal noise. The detecting unit 41 obtains, for example, a time period between edges of the reference oscillation output, detects fluctuation of a frequency due to noise other than thermal noise, generates correction value output so as to obtain the same oscillation output as oscillation output in a case where this fluctuation does not occur, and outputs the correction value output to the correcting unit 52. Note that a reference for confirming the time period between edges is an output clock from the DCO 55.

The detecting unit 41 generates correction value output which cancels out an error of the oscillation frequency due to noise other than thermal noise using the output of the history holding memory 42 and the reference oscillation output. For example, it is now assumed that the reference oscillation output frequency fluctuates and becomes a high frequency due to influence of the RTS noise. In this case, the output periods of the flip-flop 57 and the TDC 59 become short, and the phase error data becomes a small value. That is, because the phase error data which is to be subtracted from the phase control data at the correcting unit 52 becomes a small value due to influence of the RTS noise, the detecting unit 41 generates correction value output corresponding to fluctuation of the phase error data and makes the correcting unit 52 subtract the correction value output. In a similar manner, when the reference oscillation output frequency fluctuates and becomes a low frequency due to influence of the RTS noise, the detecting unit 41 generates correction value output corresponding to the fluctuation of the phase error data in this case and makes the correcting unit 52 add the correction value output.

Further, the detecting unit 41 stores a component corresponding to a ratio or a difference between the reference oscillation output frequency and the output frequency of the DCO 55 in the history holding memory 42 when comparing the value stored in the history holding memory 42 with the reference oscillation output. Further, the detecting unit 41 may be configured to normalize the correction value output using the normalization factor for converting the correction value output to a numerical value corresponding to operation of the correcting unit 52 and output the normalized correction value output to the correcting unit 52. Further, the detecting unit 41 may be configured such that an output timing of the correction value output is defined based on the output of the DCO 55.

The correcting unit 52 receives the correction value output and corrects the oscillation frequency control information. By this means, from the correcting unit 52, the oscillation frequency control information in which fluctuation due to noise other than thermal noise is cancelled out is outputted. Note that influence by the thermal noise is eliminated by the loop filter 53. In this manner, from the DCO 55, oscillation output of a frequency which is a multiplication result of the reference oscillation output frequency which is not affected by noise and the value of the ratio which is the Frequency Controlled Word can be obtained.

Next, operation of the embodiment configured as described above will be described with reference to FIG. 5A to FIG. 5D, FIG. 6 and FIG. 7. FIG. 5A to FIG. 5D are waveform diagrams for explaining correction value output generated at the detector 40, and illustrate reference oscillation output f0 from each oscillator 30, a correction value V, from the correcting unit 52 in a case where the correction value output is ignored, an output value V1 of the loop filter 53 and an oscillation frequency fp of the DCO 55. FIG. 6 is an explanatory diagram for explaining a frequency of the reference oscillation output f0 in FIG. 5A. Waveforms Wv1 to Wv3 in upper three stages in FIG. 6 respectively correspond to waveforms Wf1 to Wf3 in lower three stages.

The waveform Wv1 in FIG. 6 indicates a temporal change of a voltage of the reference oscillation output in an example where a frequency is fixed. The waveform Wf1 in FIG. 6 which indicates a frequency on a vertical axis, corresponds to the waveform Wv1, and indicates that a frequency of the waveform Wv1 is fc (constant). The waveform Wv2 indicates that the RTS noise is mixed in the reference oscillation output whose frequency is fc, and a frequency is relatively largely lowered compared to the original oscillation frequency during a period of time from when the RTS is generated until when the RTS is finished in FIG. 6. The waveform Wf2 in FIG. 6 which indicates a frequency on a vertical axis, corresponds to the waveform Wv2, and indicates that the reference oscillation output frequency is once lowered from fc to fL and further returns to fc. In a similar manner, the waveform Wv3 indicates that the RTS noise is mixed in the reference oscillation output whose frequency is fc, and a frequency is relatively largely increased compared to the original oscillation frequency during a period of time from when the RTS is generated until when the RTS is finished in FIG. 6. The waveform Wf3 in FIG. 6 which indicates a frequency on a vertical axis, corresponds to the waveform Wv3, and indicates that the reference oscillation output frequency is once increased from fc to fH and further returns to fc.

Figure 5A:
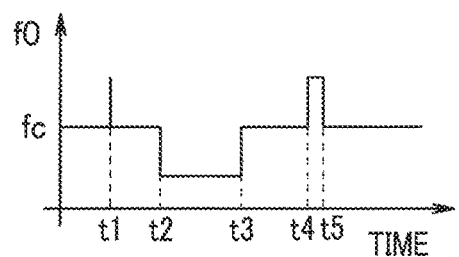
FIG. 5A is a waveform diagram for explaining correction value output generated at a detector 40.

FIG. 5A illustrates fluctuation due to such RTS noise of the reference oscillation output. That is, the example in FIG. 5A indicates that the frequency fc of the reference oscillation output changes to a frequency fH for a moment at time t1, is lowered to a frequency fL during a relatively long period of time from time t2 to t3, and increases to a frequency fH for a relatively short period of time from time t4 to t5. Due to influence of such RTS noise, a frequency or a potential of the generated signal increases or decreases from a baseline. Further, the change amount is not always the same.

It is now assumed that the correction value output is not outputted from the detector 40. That is, it is assumed that the adder 52a of the correcting unit 52 receives only the phase control data from the accumulator 51 and the phase error data from the multiplier 60 and the flip-flop 57 and obtains a difference between these data. In this case, the oscillation frequency control information from the correcting unit 52 reflects fluctuation of the reference oscillation output as illustrated in FIG. 5B.

Figure 5B:
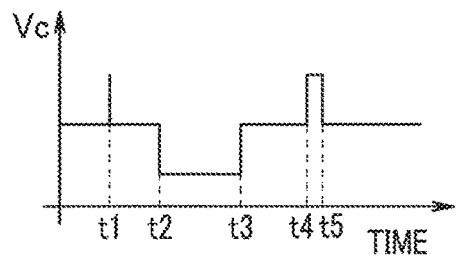
FIG. 5B is a waveform diagram for explaining correction value output generated at the detector 40.
Figure 5C:
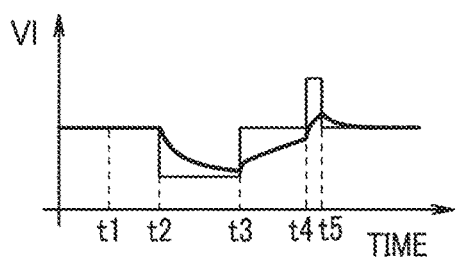
FIG. 5C is a waveform diagram for explaining correction value output generated at the detector 40.
Figure 5D:
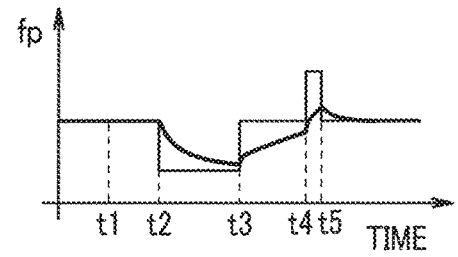
FIG. 5D is a waveform diagram for explaining correction value output generated at the detector 40.

The oscillation frequency control information illustrated in FIG. 5B is outputted to the gain normalization unit 54 via the loop filter 53. The oscillation frequency control information, for example, changes to a value V1 indicated with a thick line in FIG. 5C through filter processing of the loop filter 53. That is, a momentary frequency change at time t1 included in the oscillation frequency control information is not transmitted to the gain normalization unit 54 by the loop filter 53. Further, a frequency change from time t2 to t3 and from time t4 to t5 is integrated, and the oscillation frequency control information which changes gently is transmitted to the gain normalization unit 54.

After the gain normalization unit 54 adjusts a gain of the inputted oscillation frequency control information, the gain normalization unit 54 outputs the oscillation frequency control information to the DCO 55 as control data of the oscillation frequency. As a result, the output frequency fp of the DCO 55 fluctuates due to influence of the RTS noise as indicated with a thick line in FIG. 5D.

On the other hand, in the present embodiment, the fluctuation of the reference oscillation output due to the RTS noise illustrated in FIG. 5A is detected by the detector 40. As illustrated in FIG. 5A, the RTS noise appears discretely as a sufficiently large frequency change compared to the original reference oscillation output frequency. The detector 40 can relatively easily detect the frequency change due to the RTS noise by obtaining a change of the reference oscillation output period at the detecting unit 41 while, for example, a detection result of the reference oscillation output period being held in the history holding memory 42.

Figure 7:
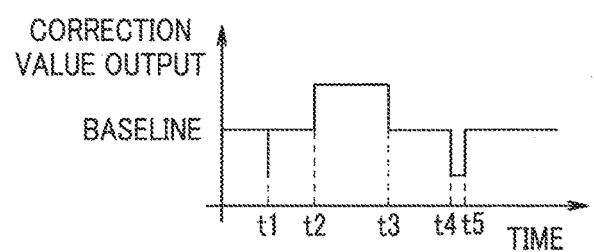
FIG. 7 is a waveform diagram illustrating one example of correction value output corresponding to FIG. 5A.

The detector 40, for example, generates correction value output which has reverse characteristics of the change of the reference oscillation frequency in FIG. 5A. Note that the correction value output from the detecting unit 41 is converted into a numerical value corresponding to the operation of the correcting unit 52 using the normalization factor. FIG. 7 is a waveform diagram illustrating one example of the correction value output corresponding to FIG. 5A. The correction value output in FIG. 7 has a value having reverse characteristics of the frequency change generated at time t1, time t2 to t3 and time t4 to t5 due to the RTS noise. By adding the oscillation frequency control information in FIG. 5B and the correction value output in FIG. 7, it is possible to obtain the oscillation frequency control information in which fluctuation of the reference oscillation output frequency based on the RTS noise is cancelled out.

By supplying this oscillation frequency control information to the DCO 55 as control data via the loop filter 53 and the gain normalization unit 54, oscillation output of a stable oscillation frequency can be obtained from the DCO 55 regardless of fluctuation of the reference oscillation output frequency due to influence of the RTS noise.

Note that because the correction value output corresponding to time t1 is not transmitted to the gain normalization unit 54 by the loop filter 53, the correction value output of this part may remain a baseline. Further, while it has been described that the detector 40 generates the correction value output having the reverse characteristics of those of the change of the reference oscillation frequency, it is obvious that it is also possible to employ a configuration in which correction value output having the same characteristics as those of the change of the reference oscillation frequency is outputted from the detector 40, and the fluctuation of the phase error data due to the RTS noise is cancelled out with the correction value output at the correcting unit 52.

Further, timing control is performed so that a timing at which the phase error data based on the fluctuation of the reference oscillation output due to the RTS noise is outputted to the correcting unit 52 matches a timing at which the correction value output corresponding to the fluctuation of the reference oscillation output is outputted from the detector 40 to the correcting unit 52.

In the present embodiment, as described above, because noise other than thermal noise included in the reference oscillation output can be detected by employing a downsized transistor as part of the oscillator which generates the reference oscillation output, and the phase error data is corrected based on the detected noise other than thermal noise, it is possible to obtain oscillation output from which influence of the noise is eliminated from the ADPLL.

Third Embodiment

Figure 8:
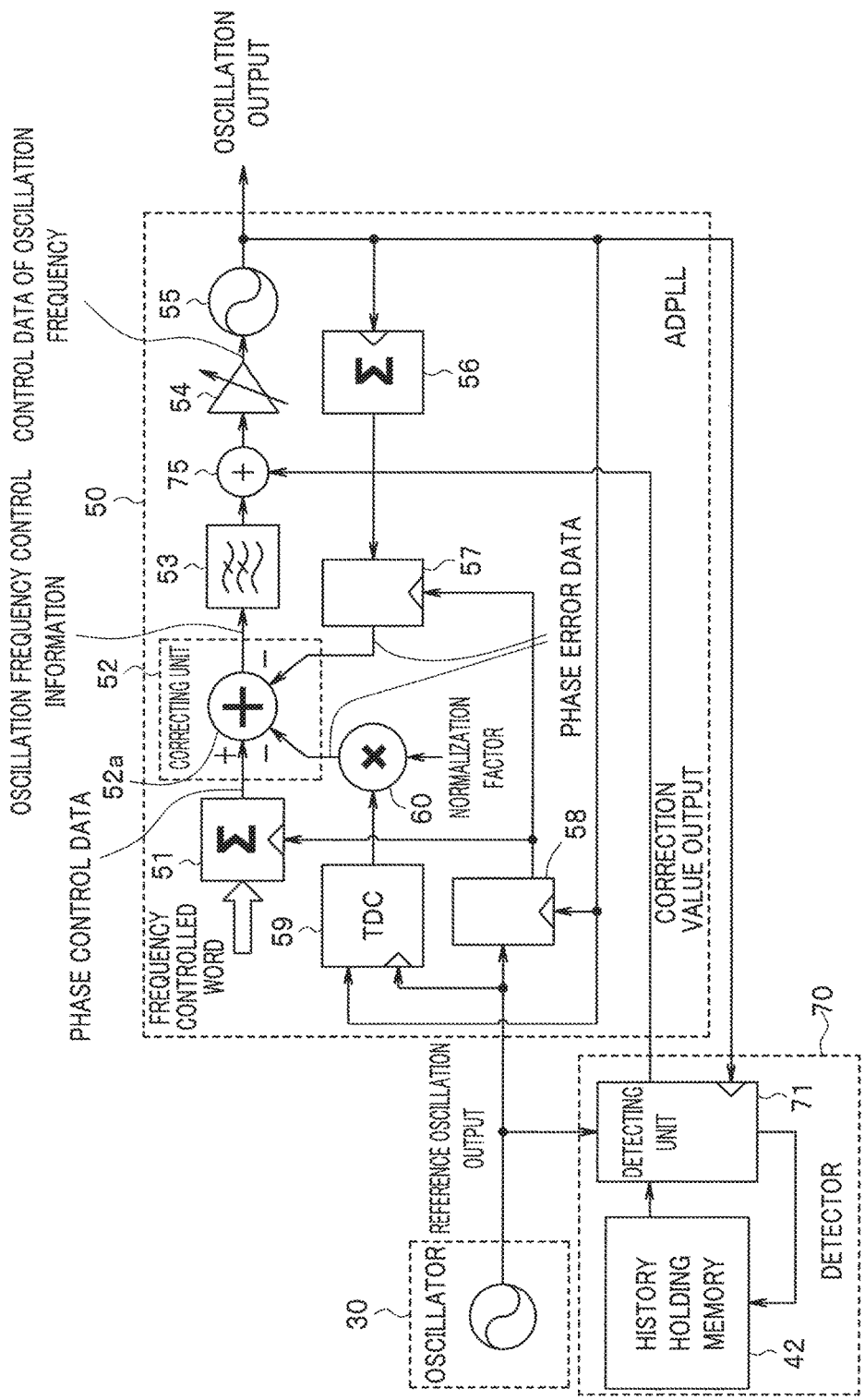
FIG. 8 is a block diagram illustrating a third embodiment of the present invention.

FIG. 8 is a block diagram illustrating a third embodiment of the present invention. In FIG. 8, the same reference numerals are assigned to components which are the same as those in FIG. 3 and its explanation will be omitted.

In the example in FIG. 7, a difference between the original reference oscillation output frequency and the actual reference oscillation output frequency at the detecting unit 41, that is, a total amount of fluctuation of the frequency of the reference oscillation output is obtained as the correction value output. In this case, the correction value output instantaneously reflects fluctuation of the reference oscillation output due to the RTS noise, and the fluctuation of the reference oscillation output due to the RTS noise can be cancelled out in a short period of time at the correcting unit 52. However, in this case, it is necessary to obtain the fluctuation of the frequency of the reference oscillation output at high speed, which is likely to cause an error. Therefore, it is also possible to employ a method for performing complement using a filter having a cutoff frequency fr, and the present embodiment is applied to this case.

In the present embodiment, a detector 70 is employed in place of the detector 40, an adder 75 is added, and the correction value output from the detector 70 is given to the adder 75. In the present embodiment, the correction value output is not supplied to the correcting unit 52. Therefore, the oscillation frequency control information from the correcting unit 52 includes the fluctuation of the reference oscillation output frequency due to the RTS noise.

In the present embodiment, the fluctuation of the oscillation frequency control information due to influence of the RTS noise is attenuated using a filter for which a predetermined cutoff frequency is set. Note that, while, in the example in FIG. 8, the loop filter 53 is used as this filter, it is also possible to employ a filter for which a predetermined cutoff frequency is set separately from the loop filter 53.

Figure 9:
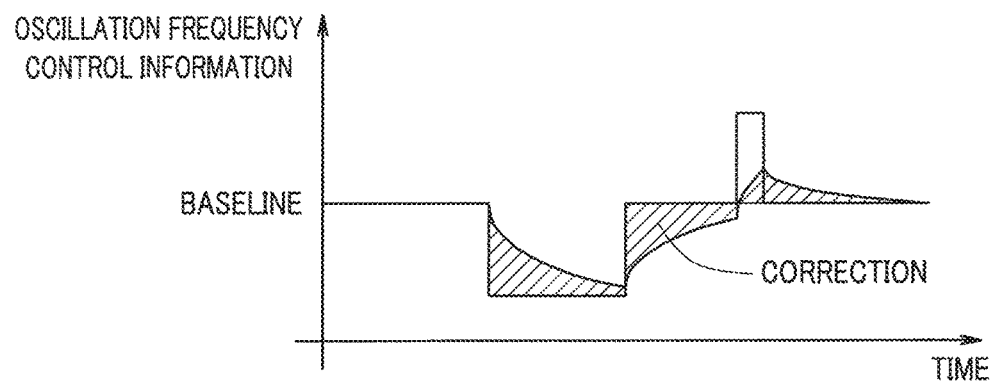
FIG. 9 is a waveform diagram for explaining an aspect where fluctuation of oscillation frequency control information due to influence of RTS noise is attenuated by a loop filter 53, the waveform diagram indicating time on a horizontal axis and reference oscillation output from the oscillator 30 on a vertical axis.
Figure 10:
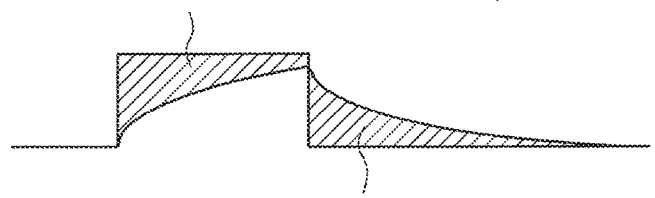
FIG. 10 is an explanatory diagram for explaining correction value output from a detector 70.

FIG. 9 is a waveform diagram for explaining an aspect in which the fluctuation of the oscillation frequency control information due to influence of the RTS noise is attenuated by the loop filter 53, the waveform diagram indicating time on a horizontal axis and the oscillation frequency control information corresponding to the reference oscillation output from the oscillator 30 on a vertical axis. Further, FIG. 10 is an explanatory diagram for explaining the correction value output from the detector 70.

The straight line in FIG. 9 indicates a change of the oscillation frequency control information corresponding to the change of the reference oscillation output. FIG. 9 illustrates a case where the reference oscillation output having a frequency of fc decreases to the frequency fL for a relatively long period of time and increases to the frequency fH for a relatively short period of time as with FIG. 5A. In the present embodiment, because the correction value output is not inputted to the correcting unit 52, as illustrated in FIG. 9, the change of the oscillation frequency control information is the same as the change of the reference oscillation output.

This oscillation frequency control information is temporally integrated by being filtered using the loop filter 53, and precipitous change is deformed to smooth change. That is, the change of the frequency is corrected by the loop filter 53. A shaded region in FIG. 9 indicates a portion corrected by the loop filter 53.

On the other hand, an output clock from the DCO 55 is given to a detecting unit 71 of the detector 70, and the change of the reference oscillation output frequency is detected using history by utilizing this clock as a time reference. Further, in the present embodiment, the detecting unit 71 calculates correction characteristics in FIG. 9 based on known characteristics of the loop filter 53. The detecting unit 71 calculates correction value output for cancelling out the fluctuation which remains without being corrected by the loop filter 53.

FIG. 10 explains this correction value output, and a shaded region R1 in FIG. 10 indicates the fluctuation which cannot be corrected by the loop filter 53 and remains, and a region R2 indicates the correction value output for correcting this fluctuation. The area of the region R1 is the same as the area of the region R2.

The detecting unit 71 generates the correction value output for cancelling out the fluctuation of the oscillation frequency control information due to influence of the RTS noise remaining in the output of the loop filter 53 and outputs the correction value output to the adder 75. The adder 75 eliminates the fluctuation due to the RTS noise included in the oscillation frequency control information by adding the correction value output to the output of the loop filter 53 and outputs the oscillation frequency control information to the gain normalization unit 54.

In the embodiment configured as described above, the fluctuation of the reference oscillation output frequency which fluctuates due to the influence of the RTS noise appears as is in the oscillation frequency control information. The fluctuation included in the oscillation frequency control information is partly corrected by the loop filter 53. The detector 70 calculates fluctuation remaining without being corrected by the loop filter 53 among the fluctuation due to the RTS noise included in the oscillation frequency control information and outputs the correction value output for cancelling out this fluctuation to the adder 75.

The adder 75 completely eliminates the fluctuation included in the RTS noise from the output of the loop filter 53 by adding the correction value output to the output of the loop filter 53 and outputs the output to the gain normalization unit 54.

As described above, also in the present embodiment, it is possible to obtain the same advantage as that of the second embodiment. In the present embodiment, a correction amount of the fluctuation due to the RTS noise itself is smoothen using the filter, so that the influence of the noise is made invisible. In the present embodiment, the influence of the noise is corrected using a filter having a predetermined cutoff frequency. When a filter for completely eliminating the influence of the RTS noise, other than the loop filter is used, if the cutoff frequency of the loop filter is lower than the cutoff frequency of this filter, the influence due to the RTS noise is not highly visible. Particularly, the present embodiment is effective to an analog corrector such as an analog PLL.

Fourth Embodiment

Figure 11:
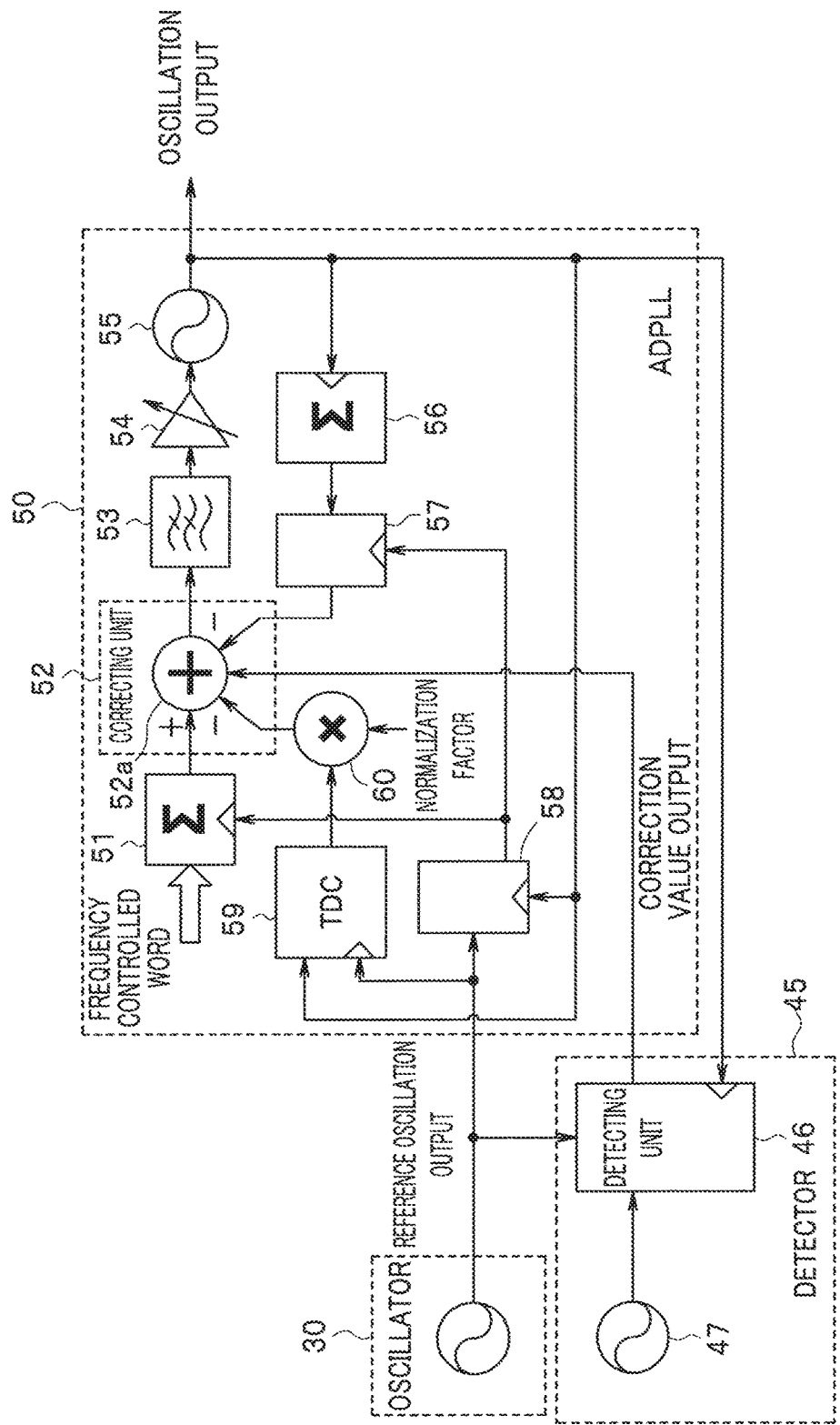
FIG. 11 is a circuit diagram illustrating a fourth embodiment.

FIG. 1 is a circuit diagram illustrating a fourth embodiment. In FIG. 11, the same reference numerals are assigned to components which are the same as those in FIG. 3, and its explanation will be omitted. The present embodiment is different from the second embodiment in that a detector 45 is employed in place of the detector 40. In the second embodiment, the influence due to the noise other than thermal noise is detected by holding a history such as the reference oscillation output from the oscillator 30. On the other hand, in the present embodiment, influence due to noise other than thermal noise in the oscillator 30 is detected using an oscillator 47 different from the oscillator 30.

The detector 45 is configured with a detecting unit 46 and the oscillator 47, and reference oscillation output from the oscillator 30 and oscillation output from the oscillator 47 are given to the detecting unit 46. Note that the oscillator 47 is configured using a transistor having a larger transistor size than that of the downsized transistor, and is configured to generate oscillation output having a frequency of a predetermined ratio with the reference oscillation output frequency from the oscillator 30. Note that because a number of RTS noise generating units exist in the oscillator 47, and the sensitivity is lower, flicker noise which relatively less affects an original signal is generated.

That is, the oscillation output frequency from the oscillator 47 is substantially constant although there is slight fluctuation. The detecting unit 46 detects an error amount of the frequency generated by the noise other than thermal noise by comparing the oscillation output from the oscillator 47 with the reference oscillation output. The detecting unit 46 generates correction value output for correcting the detected error amount and outputs the correction value output to the correcting unit 52.

The other configuration is the same as that of the second embodiment.

Figure 12:
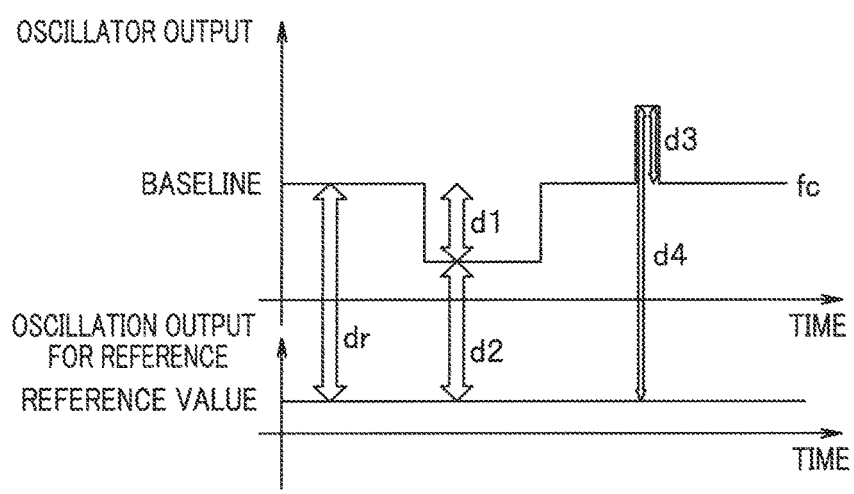
FIG. 12 is an explanatory diagram for explaining correction value output.

Subsequently, operation of the embodiment configured as described above will be described with reference to FIG. 12. FIG. 12 is an explanatory diagram for explaining the correction value output.

An upper stage of FIG. 12 indicates the reference oscillation output (oscillator output) from the oscillator 30, which includes a time period during which a frequency decreases and increases relatively largely with respect to the reference oscillation output frequency fc which becomes a basis due to the influence of the RTS noise. A lower stage of FIG. 12 indicates the oscillation output (reference oscillator output) of the oscillator 47, and fluctuation of the reference oscillation output frequency from the oscillator 30 is obtained using this oscillation output of the oscillator 47 as a reference value.

That is, the detector 45 obtains a ratio or a difference dr between the reference value of the oscillator 47 and the reference oscillation output frequency fc. The detector 45 obtains a ratio or a difference d1 with the reference oscillation output frequency and a ratio or a difference d2 with the reference value at a time point at which the frequency of the oscillator 30 relatively largely decreases. The detector 45 calculates the correction value output for correcting the fluctuation of the oscillation frequency control information using these ratios or differences dr, d1 and d2. In a similar manner, the detector 45 obtains a ratio or a difference d3 with the reference oscillation output frequency and a ratio or a difference d4 with the reference value at a time point at which the frequency of the oscillator 30 relatively largely increases. The detector 45 calculates the correction value output for correcting the fluctuation of the oscillation frequency control information using these ratios or differences dr, d3 and d4.

As described above, the detector 45 obtains the correction value output for cancelling out the detected fluctuation and outputs the correction value output to the correcting unit 52. The correcting unit 52 corrects the oscillation frequency control information using this correction value output. In this manner, the oscillation frequency control information in which the fluctuation due to the RTS noise is cancelled out can be obtained from the correcting unit 52.

In this manner, also in the present embodiment, it is possible to obtain the same advantage as that of the second embodiment.

Fifth Embodiment

Figure 13:
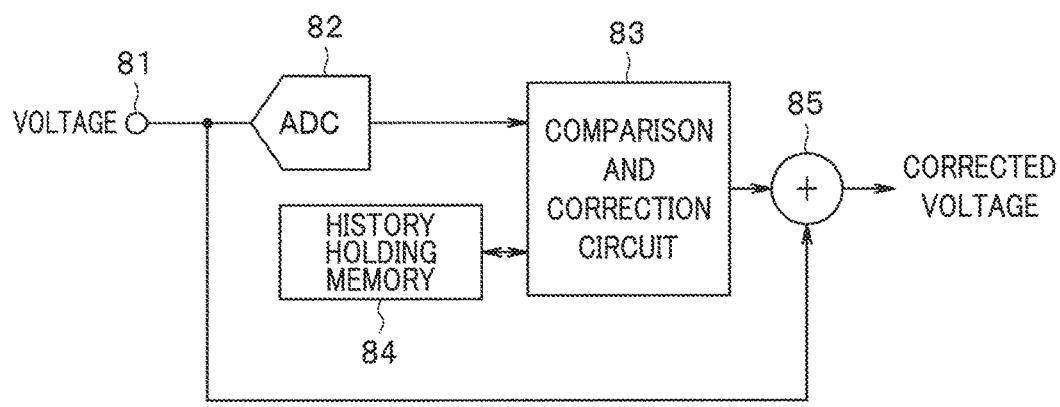
FIG. 13 is a block diagram illustrating a fifth embodiment.

FIG. 13 is a block diagram illustrating a fifth embodiment. The present embodiment indicates a case where the present invention is applied to a reference voltage/current source.

Figure 14:
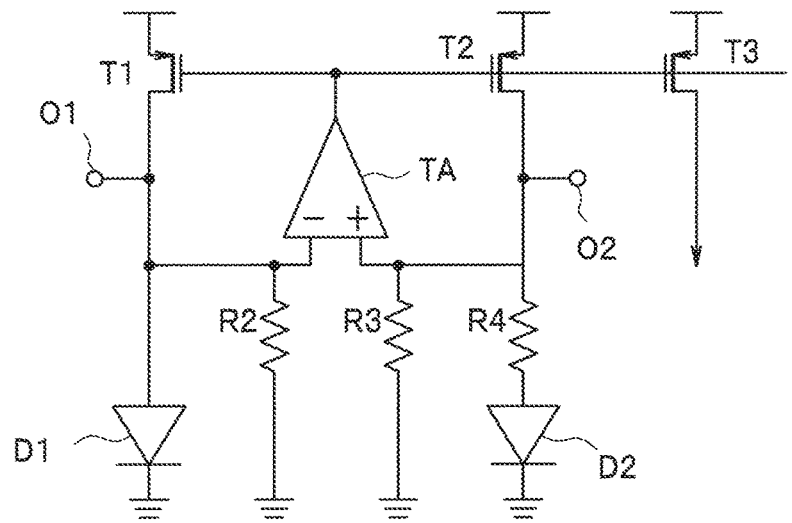
FIG. 14 is a circuit diagram illustrating one example of a specific configuration of a reference voltage/current source which is a signal generator.

FIG. 14 is a circuit diagram illustrating one example of a specific configuration of the reference voltage/current source (Bandgap reference (BGR)) which is a signal generator. The reference voltage/current source in FIG. 14 is configured to generate noise other than thermal noise such as the RTS noise.

In the reference voltage/current source in FIG. 14, diodes D1 and D2, resistances R2 to R4, transistors T1 to T3 and an operational amplifier TA are provided. Note that, typically, an effective area of the diode D1 is smaller than an effective area of the diode D2. For example, D1:D2=1:8 or D1:D2=1:24. The diode D1 and the resistance R2 are connected in parallel with each other, and series circuits of the diode D2 and the resistance R4, and the resistance R3 are connected in parallel with each other. Note that the resistances R2 and R3 are resistances for adjusting temperature characteristics and can be omitted.

A connection point of the diode D1 and the resistance R2 is connected to a terminal O1, and a connection point of a series circuit of the diode D2 and the resistance R4 and the resistance R3 is connected to a terminal O2. Note that a voltage difference between both ends of the resistance R4 can be expressed with the following expression (1).

$$ln(N) \times kT/q \qquad (1)$$

where k is a Boltzmann constant and q is elementary charge, both of which are constants. Further, T is an absolute temperature (K). N is a ratio (N=D2/D1) of effective areas of the diodes D1 and D2.

Further, an inverting input terminal of the operational amplifier TA is connected to an anode of the diode D1, and a non-inverting input terminal of the operational amplifier TA is connected to an anode of the diode D2 via the resistance R4. Further, an output terminal of the operational amplifier TA is connected to gates of the transistors T1 to T3, and power supply potential Vdd is applied to sources of the transistors T1 to T3.

A drain of the transistor T1 is connected to the inverting input terminal of the operational amplifier TA, and a drain of the transistor 12 is connected to the non-inverting input terminal of the operational amplifier TA. An output current Io which is a baseline current is outputted from a drain of the transistor T3.

Potential between the terminals O1 and O2 is compared at the operational amplifier TA. An output voltage Vc of the operational amplifier TA is controlled so that a potential difference between the terminals O1 and O2 approaches zero, and is applied to gates of the transistors T1 to T3. When the output voltage Vc is applied to the gates of the transistors T1 and T2, a current is supplied to the diode D1 and the resistance R2 via the terminal O1, and a current is supplied to the diode D2 and the resistance R3 via the terminal O2.

When the temperature increases and a reference voltage of the diode decreases, a current flowing in the resistances R2 and R3 becomes small. The current flowing in the diodes D1 and D2 is proportional to a current flowing in the resistance R4. Because the current flowing in the resistance R4 is proportional to the absolute temperature as expressed in the above expression (1), a current of the diodes D1 and D2 has positive temperature characteristics. Because current paths of the diodes D1 and D2 have positive temperature characteristics, and current paths of the resistances R2 and R3 have negative temperature characteristics, slope of fluctuation of the output current Io can be adjusted by adjusting these temperature characteristics.

In the reference voltage/current source in FIG. 14, by employing a downsized transistor as the transistors T1 to T3 which are sources of flicker noise, this reference voltage/current source generates noise other than thermal noise, such as the RTS noise. For example, in both of a baseline voltage appearing between the terminals O1 and O2, and a baseline current flowing in the drain of the transistor T3, the RTS noise appears discretely at a relatively large level with respect to an original signal.

Figure 15A:
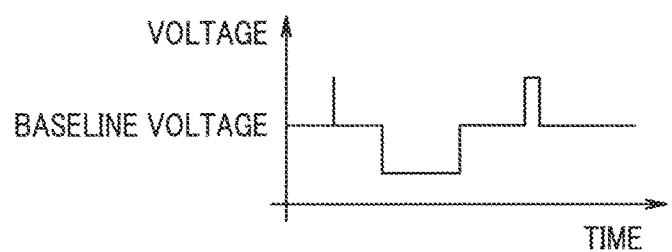
FIG. 15A is a waveform diagram illustrating an example of a case where noise other than thermal noise is mixed in a baseline voltage appearing between terminals O1 and O2.
Figure 15B:
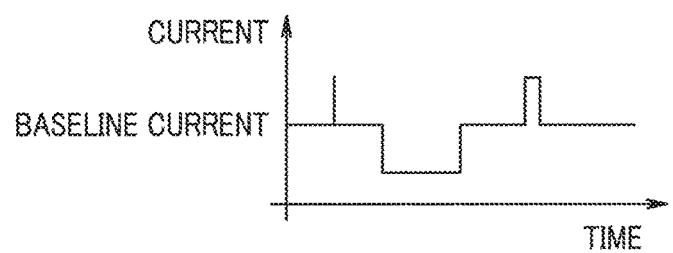
FIG. 15B is a waveform diagram illustrating an example of a case where noise other than thermal noise is mixed in a baseline current appearing in a drain of a transistor T3.

FIG. 15A is a waveform diagram illustrating an example of a case where noise other than thermal noise is mixed in the baseline voltage appearing between the terminals O1 and O2, and FIG. 15B is a waveform diagram illustrating an example of a case where noise other than thermal noise is mixed in the baseline current appearing in the drain of the transistor T3. In the example of FIG. 15A, a voltage value of the baseline voltage increases for a moment due to influence of the noise other than thermal noise, becomes lower for a relatively long predetermined period of time, and increases for a relatively short predetermined period of time. Further, in the example of FIG. 15B, a current value of the baseline current increases for a moment due to influence of the noise other than thermal noise, becomes lower for a relatively long predetermined period of time, and increases for a relatively short predetermined period of time.

In FIG. 13, baseline voltage output between the terminals O1 and O2 of FIG. 14 is supplied to an input terminal 81. The voltage supplied to the input terminal 81 is given to a comparison and correction circuit 83 via an ADC (analog-digital converter) 82. Note that a high-resolution converter may be employed as the ADC 82, and may operate at a relatively low sampling rate. For example, as the ADC 82, it is possible to employ a successive-approximation type (SRS type), a delta-sigma type, a pipeline type, or the like.

The comparison and correction circuit 83 detects a change of the inputted voltage while storing the output of the ADC 82 in a history holding memory 84. Note that the comparison and correction circuit 83 has a voltage/current generator different from the reference voltage/current source which generates a voltage to be supplied to the input terminal 81. As one example, it is also possible to use a reference voltage/current source which uses a transistor larger than the downsized transistor. In this case, a level of influence of minute noise other than thermal noise generated inside the comparison and correction circuit 83 which will affect the corrected voltage of the output of the adder/subtractor 85 becomes small because a voltage amount generated at the comparison and correction circuit 83 is sufficiently smaller than the voltage supplied via the input terminal 81. The baseline voltage output between the terminals O1 and O2 is affected by the noise other than thermal noise, and an original baseline voltage changes discretely at a relatively large level. By this means, the comparison and correction circuit 83 can obtain fluctuation of the baseline voltage output generated due to influence of the noise other than thermal noise.

The voltage supplied to the input terminal 81 is also given to the adder/subtractor 85, and the adder/subtractor 85 eliminates the fluctuation due to influence of the noise other than thermal noise from the baseline voltage inputted via the input terminal 81 and outputs the result.

Note that while FIG. 13 illustrates a circuit which corrects the output of the voltage source, a circuit which corrects output of the current source can be configured in a similar manner. For example, it is also possible to change the ADC 82 to a converter to which a current can be inputted, or employ a method in which a current is divided and part of the current is converted and compared.

As described above, also in the present embodiment, it is possible to obtain the same advantage as that of the first embodiment.

Sixth Embodiment

Figure 16:
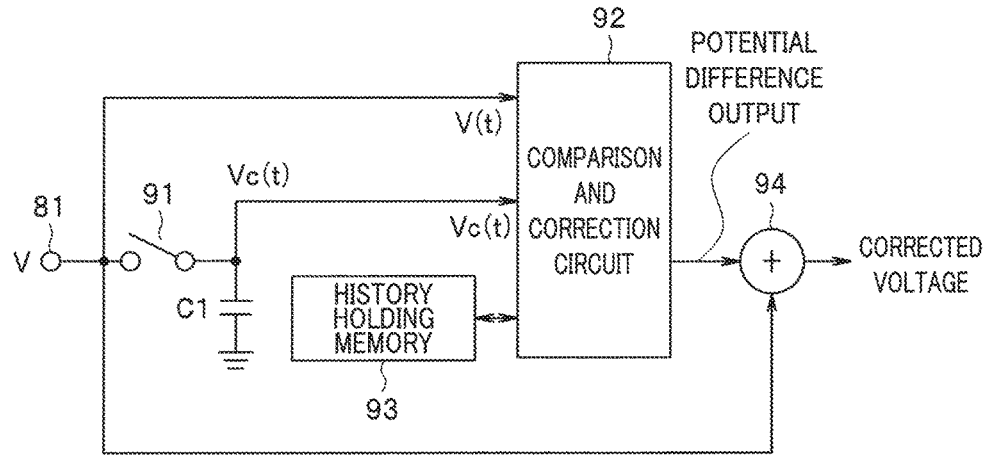
FIG. 16 is a block diagram illustrating a sixth embodiment.

FIG. 16 is a block diagram illustrating a sixth embodiment. In FIG. 16, the same reference numerals are assigned to components which are the same as those in FIG. 13, and its explanation will be omitted. The present embodiment describes an example where fluctuation of a voltage due to noise other than thermal noise is detected in an analog manner.

Baseline voltage output V between the terminals O1 and O2 in FIG. 14 is given to the input terminal 81. This baseline voltage output V is applied to a capacitor C1 via a switch 91 and supplied to a comparison and correction circuit 92 and an adder/subtractor 94. Further, a terminal voltage of the capacitor C1 is supplied to the comparison and correction circuit 92.

It is now assumed that a voltage of the baseline voltage output V at predetermined time is V(t), the terminal voltage of the capacitor C1 is Vc(t). The comparison and correction circuit 92 obtains a difference between the voltages V(t) and Vc(t), provides the obtained difference to a history holding memory 93, and stores the difference in the history holding memory 93. The comparison and correction circuit 92 detects whether or not a ratio of a change of the difference becomes larger than a predetermined threshold from the history of the difference stored in the history holding memory 93. When the ratio of the change of the difference becomes larger than the predetermined threshold, the comparison and correction circuit 92 determines that the change is due to influence of the RTS noise, and stores a change amount of the difference at a time point of the change, that is, a change amount of the difference between the voltage V(t) and the voltage Vc(t) in the history holding memory 93, and outputs the change amount to the adder/subtractor 94 as potential difference output. The comparison and correction circuit 92 accumulates, updates and provides the potential difference output to the adder/subtractor 94 every time the influence due to the RTS noise occurs.

The adder/subtractor 94 outputs a voltage (corrected voltage) from which the influence due to the RTS noise is eliminated by, for example, subtracting the potential difference output from the comparison and correction circuit 92 from the voltage V(t) from the input terminal 81.

Figure 17A:
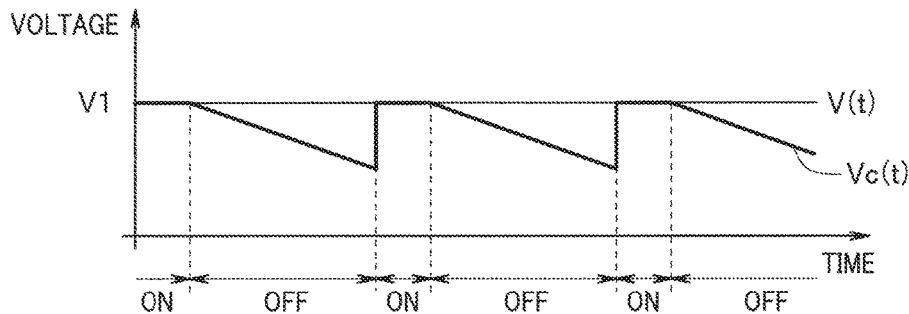
FIG. 17A is a waveform diagram for explaining operation of a comparison and correction circuit 92, the waveform diagram indicating time on a horizontal axis and a voltage on a vertical axis.
Figure 17B:
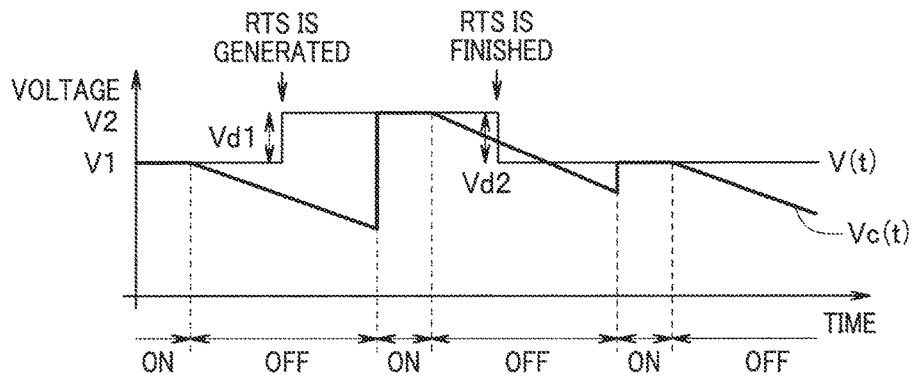
FIG. 17B is a waveform diagram for explaining operation of the comparison and correction circuit 92, the waveform diagram indicating time on a horizontal axis and a voltage on a vertical axis.

Subsequently, operation of the embodiment configured as described above will be described with reference to FIG. 17A and FIG. 17B. FIG. 17A and FIG. 17B are waveform diagrams for explaining operation of the comparison and correction circuit 92, the waveform diagrams indicating time on a horizontal axis and a voltage on a vertical axis.

The baseline voltage output V between the terminals O1 and O2 in FIG. 14 is given to the input terminal 81. The capacitor C1 is charged with the baseline voltage output V while the switch 91 is turned on. While the switch 91 is turned on, the terminal voltage of the capacitor C1 decreases due to a predetermined leak current.

It is now assumed that the baseline voltage output V is a constant value V1. In this case, the voltage V(t) supplied to the comparison and correction circuit 92 is constant as illustrated in FIG. 17A. On the other hand, as illustrated in FIG. 17A, the terminal voltage Vc(t) of the capacitor C1 has characteristics of becoming the voltage V1 while the switch 91 is turned on, and decreasing at predetermined slope due to a leak current while the switch 91 is turned off.

The comparison and correction circuit 92 sequentially obtains a difference between the voltage V(t) and the voltage Vc(t) and stores the difference in the history holding memory 93. As illustrated in FIG. 17A, while the switch 91 is turned on, the difference is zero, while when the switch 91 is turned off, the difference gradually increases. In this case, a ratio of a change of the difference is substantially constant, and the comparison and correction circuit 92 determines that the baseline voltage output V is not affected by the influence due to noise other than thermal noise. In this case, the comparison and correction circuit 92 keeps the potential difference output zero.

Subsequently, it is assumed that the baseline voltage output V includes noise other than thermal noise, such as the RTS noise. For example, it is assumed that the baseline voltage output V1 increases from V1 to V2 at a predetermined timing due to influence of the RTS noise and returns to V1 after the elapse of a predetermined period of time. In this case, the voltage V(t) supplied to the comparison and correction circuit 92 becomes the voltage V1 for a period of time while not being affected by the RTS noise and increases to the voltage V2 only for a period of time while being affected by the influence of the RTS noise as illustrated in FIG. 17B.

On the other hand, as illustrated in FIG. 17B, the terminal voltage Vc(t) of the capacitor C1 becomes the same voltage as the voltage V(t) while the switch 91 is turned on. That is, while the switch 91 is turned on, the terminal voltage Vc(t) becomes the voltage V1 for a period of time while not being affected by the RTS noise, and becomes the voltage V2 only for a period of time while being affected by the RTS noise. Further, as illustrated in FIG. 17B, while the switch 91 is turned off, the terminal voltage Vc(t) of the capacitor C1 decreases at predetermined slope from a voltage at the time at which the switch 91 is turned on.

The comparison and correction circuit 92 sequentially obtains the difference between the voltage V(t) and the voltage Vc(t) and stores the difference in the history holding memory 93. As illustrated in FIG. 17B, when the RTS noise is generated, the difference between the voltage V(t) and the voltage Vc(t) drastically increases compared to the difference immediately before. The comparison and correction circuit 92 determines that the baseline voltage output V fluctuates at this timing due to the influence of the RTS noise, stores a change amount of the difference at this timing in the history holding memory 93 and outputs the change amount to the adder/subtractor 94 as the potential difference output. As illustrated in FIG. 17B, a change amount Vd1 of the difference at the time when the RTS noise is generated is V2−V1.

The adder/subtractor 94 corrects the baseline voltage output V with the potential difference output from the comparison and correction circuit 92. For example, the adder/subtractor 94 obtains the corrected voltage V1 through operation V2−(V2−V1) of subtracting the potential difference output (V2−V1) from the comparison and correction circuit 92 from the baseline voltage output V2 during a period of time while the RTS noise is generated.

Further, as illustrated in FIG. 17B, the change amount Vd2 of the difference at the time when the RTS noise is finished is V1−V2. The comparison and correction circuit 92 obtains new potential difference output by accumulating the change amount at the time point at which the RTS noise is finished. The potential difference output at the time when the RTS noise is finished in FIG. 17B becomes (V2−V1)+(V1−V2)=0. The adder/subtractor 94 obtains the corrected voltage V1 by subtracting the potential difference output zero from the comparison and correction circuit 92 from the baseline voltage output V1 when the RTS noise is finished.

Other operations and effects are the same as those in the first embodiment.

Note that the RTS noise is also included in the potential difference output from the comparison and correction circuit 92. However, because the potential difference output is sufficiently small compared to a level of the baseline voltage output V, influence of the RTS noise included in the potential difference output on the corrected voltage is extremely small.

Seventh Embodiment

Figure 18:
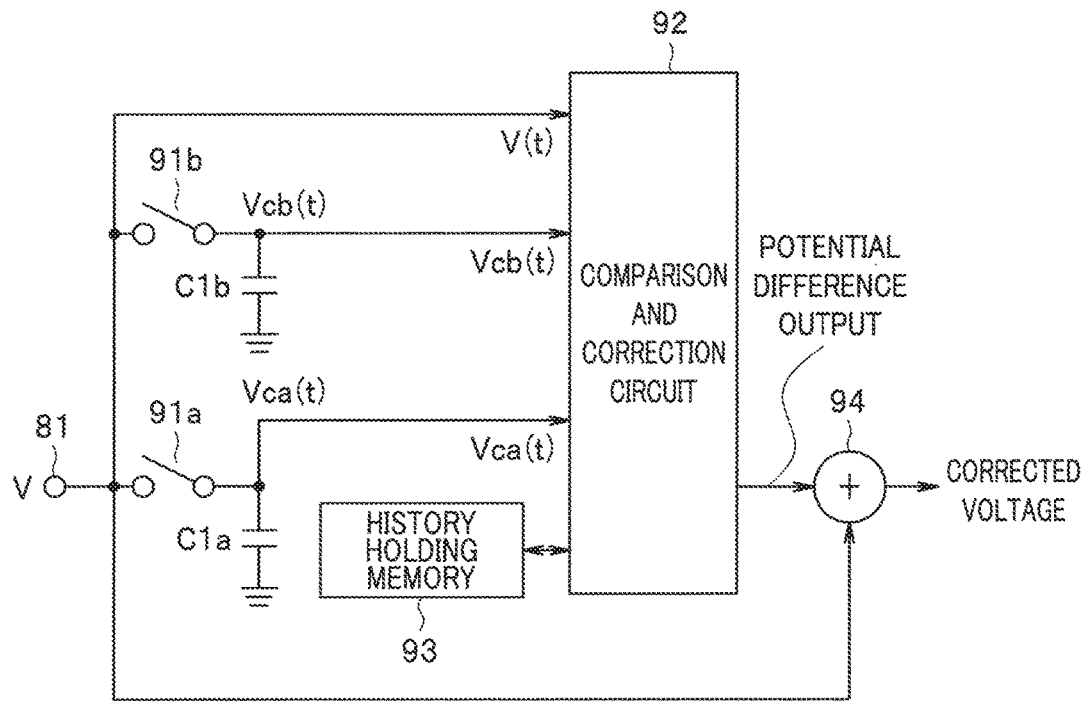
FIG. 18 is a block diagram illustrating a seventh embodiment.

FIG. 18 is a block diagram illustrating a seventh embodiment. In FIG. 18, the same reference numerals are assigned to components which are the same as those in FIG. 16, and its explanation will be omitted. In the sixth embodiment, whether or not the baseline voltage output V is affected by the RTS noise is determined by the change amount of the difference of the baseline voltage output V. However, while the switch 91 is turned on, even when the baseline voltage output V is affected by the RTS noise, the difference becomes zero and it is impossible to perform determination. Therefore, the present embodiment enables determination whether or not the baseline voltage output V is affected by the RTS noise at any timing.

In FIG. 18, the switches 91a and 91b are set so as not to be turned on at the same time, so that when one of the switches is turned on, the other switch is always turned off. Capacitors C1a and C1b are configured so that the baseline voltage output V is supplied from the input terminal 81 via respective switches 91a and 91b. The capacitors C1a and C1b are configured to be charged with the baseline voltage output V while each of the switches 91a and 91b is turned on as with the capacitor C1.

The voltage V(t) and terminal voltages Vca(t) and Vcb(t) of the capacitors C1a and C1b are given to the comparison and correction circuit 92. The comparison and correction circuit 92 sequentially obtains a difference between the voltage V(t) and the voltage Vca(t) and a difference between the voltage V(t) and the voltage Vcb(t) and stores the differences in the history holding memory 93.

The comparison and correction circuit 92 determines whether the RTS noise is mixed using the difference between the voltage V(t) and the voltage Vcb(t) while the switch 91a is turned on, and determines whether the RTS noise is mixed using the difference between the voltage V(t) and the voltage Vca(t) while the switch 91b is turned on.

Other configurations and operational effects are the same as those in the sixth embodiment.

As described above, in the present embodiment, it is possible to obtain the same advantages as those in the sixth embodiment, and reliably determine whether or not the baseline voltage output is affected by the RTS noise.

Modified Example

Figure 19:
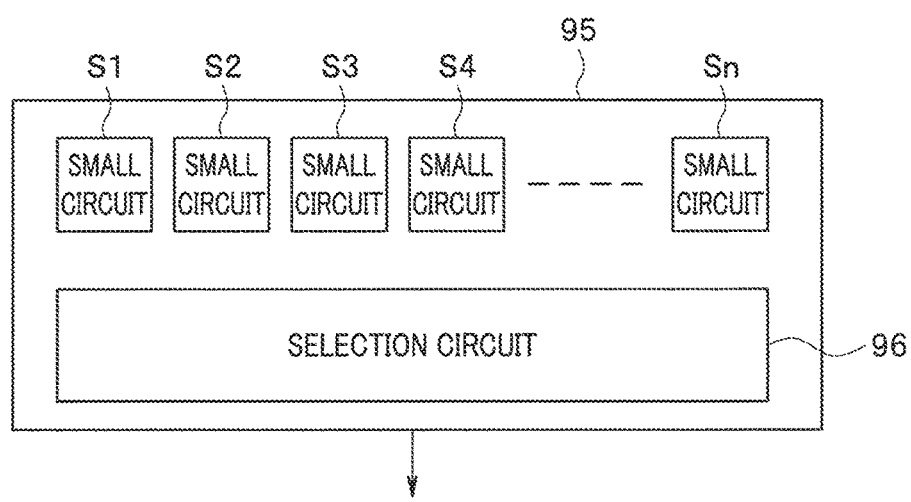
FIG. 19 is a circuit diagram illustrating a signal generator employed in a modified example.

FIG. 19 is a circuit diagram illustrating a signal generator employed in a modified example. The signal generator 95 is configured to include a plurality of small circuits S1, S2, . . . , Sn, and a selection circuit 96 which selectively outputs output of the small circuits S1, S2, . . . , Sn. Most of transistors adapted in the small circuits S1, S2, . . . , Sn are downsized transistors. The small circuits S1, S, . . . may respectively constitute the signal generator 10 in FIG. 1, or may be a part, for example, one transistor, which constitutes each part of the signal generator 10. That is, a plurality of signal generators 10 in FIG. 1 are configured with the small circuits S1, S2, . . . . The selection circuit 96 constitutes one signal generator 10 by selecting one or more small circuit constituting one signal generator 10 in which influence of a noise component other than thermal noise on a signal is the greatest among the plurality of constituted signal generators 10.

By this means, the signal generator 95 can reliably and discretely generate noise other than thermal noise and can increase influence of the noise other than thermal noise on the signal, so that it is possible to reliably detect influence of the noise other than thermal noise on the signal.

Further, in addition, it is possible to create a circuit in which influence of noise is further suppressed by selecting a small circuit in which noise other than thermal noise such as RTS is less generated. Note that confirmation of generation of the noise other than thermal noise can be applied, for example, in a test before shipment which is performed when equipment is shipped from a factory, and, in addition, a small circuit in which an amount of noise other than thermal noise generated under an environment during operation can be confirmed and applied even during actual operation.

Note that, in the above-described embodiments, while an example where the present invention is employed in the ADPLL and the reference voltage/current source is described as a specific example, the present invention can be applied to all signal generators which generate noise other than thermal noise which is discrete, and greatly affect a signal, and, for example, the present invention can be applied to an image sensor, or the like.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. Equipment having a noise elimination function, comprising:
   a signal generator configured to generate a signal in which a noise component other than thermal noise is discretely included;
   a noise detecting unit configured to detect the noise component other than the thermal noise discretely included in an output of the signal generator using a history of the output of the signal generator; and
   a signal correcting unit configured to eliminate the noise component detected by the noise detecting unit from the output of the signal generator;
   wherein the signal generator comprises a transistor having a size equal to or smaller than a predetermined transistor size, in which the noise other than thermal noise is discretely generated.

2. The equipment having the noise elimination function according to claim 1,
   wherein the noise detecting unit detects the noise component other than the thermal noise discretely included in the output of the signal generator using a history of the output of the signal generator.

3. The equipment having the noise elimination function according to claim 1,
   wherein the signal correcting unit eliminates the noise component other than the thermal noise from the output of the signal generator using a difference between a signal component included in the output of the signal generator and the noise component other than the thermal noise discretely included in the output of the signal generator.

4. The equipment having the noise elimination function according to claim 2,
   wherein the signal correcting unit eliminates the noise component other than the thermal noise from the output of the signal generator using a difference between a signal component included in the output of the signal generator and the noise component other than the thermal noise discretely included in the output of the signal generator.

5. The equipment having the noise elimination function according to claim 1,
   wherein the signal generator is configured with an oscillator configured to output reference oscillation output as the signal,
   the noise detecting unit detects a frequency error discretely included in the reference oscillation output as the noise component other than the thermal noise, and
   the signal correcting unit is configured with a frequency error correcting unit provided within a feedback loop of a PLL circuit configured to generate oscillation output based on the reference oscillation output from the oscillator.

6. The equipment having the noise elimination function according to claim 1,
   wherein the signal generator comprises:
   a plurality of small circuits configured to generate a plurality of signals in which a noise component other than thermal noise is discretely included; and
   a selection circuit configured to select from the plurality of small circuits one or more small circuits which generate a signal in which influence of the noise other than the thermal noise on the signal is greatest among the plurality of signals in which the noise component other than thermal noise is discretely included.

7. A PLL circuit comprising:
   an oscillator configured to generate reference oscillation output in which a noise component other than thermal noise is discretely included;
   a noise detecting unit configured to detect a frequency error discretely included in the reference oscillation output as the noise component other than thermal noise;
   a feedback loop configured to receive the reference oscillation output from the oscillator and oscillation output based on the reference oscillation output, and correct a phase error between the reference oscillation output in which the frequency error is discretely included and the oscillation output to make the oscillation output converge on a frequency based on the reference oscillation output; and
   a signal correcting unit provided within the feedback loop and configured to correct the frequency error discretely included in the reference oscillation output based on a detection result of the noise detecting unit.

8. The PLL circuit according to claim 7,
   wherein the signal correcting unit corrects the frequency error discretely included in the reference oscillation output by providing the detection result of the noise detecting unit to a correcting unit configured to correct a phase error between the reference oscillation output in which the frequency error is discretely included and the oscillation output.

9. The PLL circuit according to claim 7,
   wherein the signal correcting unit corrects the frequency error discretely included in the reference oscillation output by correcting output of a filter provided within the feedback loop based on the detection result of the noise detecting unit.

10. The PLL circuit according to claim 7,
    wherein the noise detecting unit comprises:
    a reference oscillator configured to generate oscillation output for reference of a frequency having a predetermined relationship with a frequency of the reference oscillation output; and
    a detecting unit configured to detect a ratio or a difference between the frequency of the reference oscillation output and the frequency of the oscillation output for reference as the frequency error discretely included in the reference oscillation output.

11. A voltage/current source comprising:
    a reference voltage/reference current generating unit configured to generate a reference voltage or a reference current in which a noise component other than thermal noise is discretely included;

a noise detecting unit configured to detect fluctuation discretely included in the reference voltage or the reference current as the noise component other than the thermal noise; and a signal correcting unit configured to eliminate the noise component detected by the noise detecting unit from output of the reference voltage/reference current generating unit.

12. The voltage/current source according to claim 11, wherein the noise detecting unit converts the reference voltage or the reference current into a digital value and detects the fluctuation discretely included in the reference voltage or the reference current based on a history of the converted digital value.

13. The voltage/current source according to claim 11, wherein the noise detecting unit comprises:

a capacitor whose terminal voltage changes by the capacitor being charged by the reference voltage being applied in a first period of time and by the capacitor being discharged by a leak current in a second period of time; and a comparing unit configured to obtain a difference between the reference voltage and the terminal voltage, wherein the fluctuation discretely included in the reference voltage is detected based on a change of the difference obtained by the comparing unit.

14. The voltage/current source according to claim 11, comprising:

a first capacitor whose terminal voltage changes by the first capacitor being charged by the reference voltage being applied in a first period of time and by the first capacitor being discharged by a leak current in a second period of time;

a second capacitor whose terminal voltage changes by the second capacitor being charged by the reference voltage being applied in a third period of time which is different from the first period of time and by the second capacitor being discharged by a leak current in a fourth period of time; and a comparing unit configured to obtain a difference between the reference voltage and the terminal voltage of the first capacitor in the first period of time and to obtain a difference between the reference voltage and the terminal voltage of the second capacitor in the third period of time, wherein fluctuation discretely included in the reference voltage is detected based on a change of the difference obtained by the comparing unit.

* * * * *